United States Patent
Di Stefano (10) Patent No.: US 7,382,143 B2
(45) Date of Patent: Jun. 3, 2008

(54) WAFER PROBE INTERCONNECT SYSTEM

(75) Inventor: Thomas H. Di Stefano, Monte Sereno, CA (US)

(73) Assignee: Centipede Systems, Inc., San Jose, CA (US)

( * ) Notice: Subject to any disclaimer, the term of this patent is extended or adjusted under 35 U.S.C. 154(b) by 0 days.

(21) Appl. No.: 11/559,272

(22) Filed: Nov. 13, 2006

(65) Prior Publication Data

US 2007/0268031 A1    Nov. 22, 2007

Related U.S. Application Data

(60) Provisional application No. 60/802,086, filed on May 18, 2006.

(51) Int. Cl.
G01R 31/02 (2006.01)

(52) U.S. Cl. .................................... 324/754

(58) Field of Classification Search ............... 324/754
See application file for complete search history.

(56) References Cited

U.S. PATENT DOCUMENTS

| | | | |
|---|---|---|---|
| 4,899,099 A | 2/1990 | Mendenhall et al. | |
| 4,968,931 A | 11/1990 | Littlebury et al. | |
| 4,975,638 A | 12/1990 | Evans et al. | |
| 5,020,219 A | 6/1991 | Leedy | |
| 5,336,992 A | 8/1994 | Saito et al. | |
| 5,339,027 A | 8/1994 | Woith et al. | |
| 5,479,109 A | 12/1995 | Lau et al. | |
| 5,682,064 A | 10/1997 | Atkins et al. | |
| 5,798,565 A | 8/1998 | Atkins et al. | |
| 5,841,291 A | 11/1998 | Liu | |
| 5,863,813 A * | 1/1999 | Dando | 438/114 |
| 5,949,246 A | 9/1999 | Frankeny et al. | |
| 6,060,891 A | 5/2000 | Hembree et al. | |
| 6,064,217 A * | 5/2000 | Smith | 324/760 |
| 6,069,482 A * | 5/2000 | Hilton | 324/755 |
| 6,271,674 B1 | 8/2001 | Hasegawa et al. | |
| 6,275,051 B1 | 8/2001 | Batchelder et al. | |
| 6,275,052 B1 | 8/2001 | Hembree et al. | |
| 6,330,744 B1 | 12/2001 | Docherty et al. | |
| 6,705,876 B2 * | 3/2004 | Eldridge | 439/66 |
| 6,712,621 B2 | 3/2004 | Li et al. | |
| 6,731,123 B2 | 5/2004 | Kimoto | |
| 6,750,669 B2 | 6/2004 | Holcombe | |
| 6,784,678 B2 * | 8/2004 | Pietzschmann | 324/758 |
| 6,911,835 B2 * | 6/2005 | Chraft et al. | 324/754 |
| 7,029,288 B2 * | 4/2006 | Li | 439/66 |
| 7,230,438 B2 * | 6/2007 | Crippen | 324/754 |
| 2004/0046579 A1 | 3/2004 | Chraft et al. | |

* cited by examiner

*Primary Examiner*—Ha Nguyen
*Assistant Examiner*—Karen M Kusumakar
(74) *Attorney, Agent, or Firm*—Townsend and Townsend and Crew LLP; Kenneth R. Allen (57) ABSTRACT

A wafer probe interconnect apparatus for use in testing a plurality of uncut chips in a semiconductor wafer. The apparatus includes a support block and a dielectric substrate coupled to the support block and supported on a patterned array of posts to inhibit displacement of the dielectric substrate under load. The dielectric substrate has probe tips protruding from a first surface and a number of contacts on a second opposing surface. The probe tips are electrically coupled to the contacts by conductive vias passing from the first surface to the second opposing surface. The posts are sufficiently pliant to allow for thermal expansion of the dielectric substrate without warpage of the dielectric substrate.

1 Claim, 5 Drawing Sheets

WAFER PROBE INTERCONNECT SYSTEM

BACKGROUND OF THE INVENTION

This invention relates to an apparatus for testing semiconductor chips on an uncut wafer containing unseparated die prior to packaging or on an array of separate integrated circuit (IC) chips. More particularly, this invention relates to parallel testing of IC chips over all or substantially all of an uncut wafer. The invention could also be used for testing a plurality of circuits in parallel which are mounted on a substrate, such as hybrid circuits.

Semiconductor manufacturers are now producing semiconductor wafers with hundreds or even thousands of integrated circuits per wafer. As device geometries decrease and the size of the semiconductor wafers increase, the number of integrated circuit dies formed on each wafer is continuing to increase. Consequently, wafer level testing has become a widely accepted method for screening out defective ICs as early as possible in the manufacturing process.

In some wafer scale testing equipment, a number of probes are placed in contact with selected regions of a particular wafer under test. In some test equipment, a probe is contacted to each bonding pad on an individual die. Using computer controlled testing equipment, voltages are generated at the probe tips, thereby testing a certain number of ICs from a given wafer. Typically such a procedure involves testing each die in order to determine whether each die passes basic electrical tests, such as a test for electrical opens or electrical shorts. In some applications, a functional test is also performed using the probe equipment to ensure that the ICs performs as designed. As demands for the number of elements of a circuit or a wafer to be tested increase, the strains on testing equipment become evident. However, the number of contact probes cannot be increased easily because the net force loading of contact probes against a surface increases with the total number of probes, which can cause numerous problems.

Figure 1:
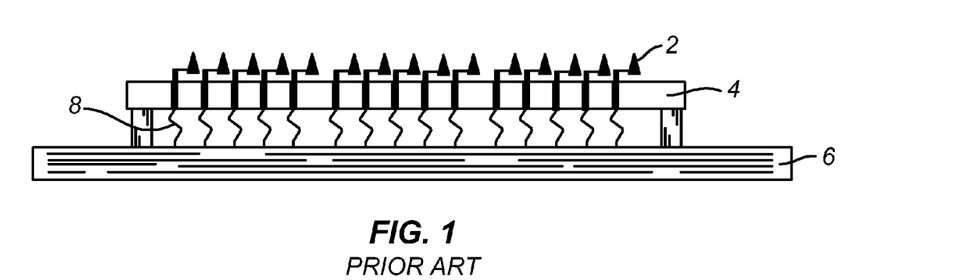
FIG. 1 is a simplified side cross-sectional view of a portion of a wafer probe head of the prior art showing an unloaded configuration.

FIG. 1 is a simplified side cross-sectional view of a portion of a wafer probe head of the prior art showing an unloaded configuration. In FIG. 1, a number of probe tips 2 are mounted on a multi-layer ceramic substrate 4 fabricated from co-fired alumina. The ceramic substrate is mounted on a printed circuit board 6 by a clamping mechanism (not shown) or by other means. Connection between the probe tips 2 and the printed circuit board 6 is provided by spring wires 8. As illustrated in FIG. 1, the support of the probe tip structure is limited to the periphery of the ceramic substrate.

Figure 2:
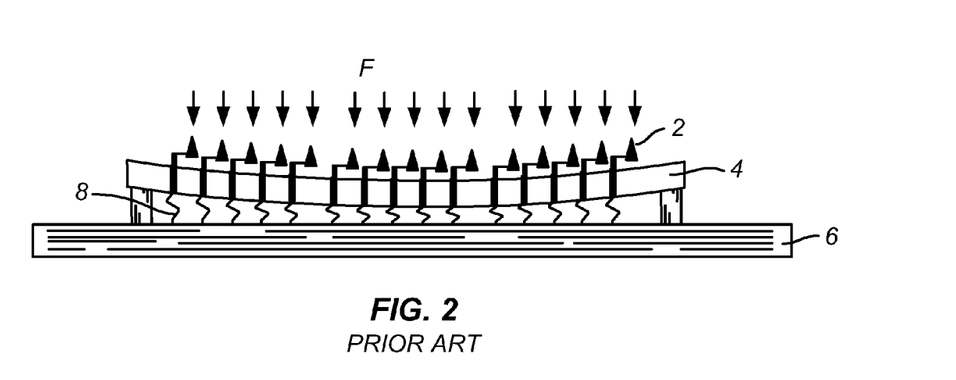
FIG. 2 is a simplified side cross-sectional view of a portion of a wafer probe head of the prior art showing a loaded configuration.

FIG. 2 is a simplified side cross-sectional view of a portion of a wafer probe head of the prior art under a load. As illustrated in FIG. 2, loading from a contact force is illustrated by force F and the arrows directed toward the probe tips. Under load, the ceramic substrate warps as illustrated. In some high density applications, the substrate warpage approaches a displacement on the same level as the displacement range of the probe tips themselves. As a consequence, the probe tips do not make uniform or reliable contact with the wafer under test or device under test (DUT). What is needed is a more reliable probe head that is resistant to substrate warpage.

SUMMARY OF THE INVENTION

According to the invention, an apparatus is provided for testing semiconductor wafers containing unseparated or uncut dies, particularly in parallel with one another wherein a plurality of posts on a rigid support block support a dielectric substrate or the like in a uniform pattern to inhibit displacement of the dielectric substrate under load.

According to an embodiment of the present invention, a wafer probe interconnect apparatus includes a support block and a probe head comprising a dielectric substrate having a plurality of probe tips protruding from a first surface and a plurality of contacts on a second opposing surface. The plurality of probe tips is electrically coupled to the plurality of contacts by conductive vias passing from the first surface to the second opposing surface. The apparatus also includes a plurality of posts on the rigid support block supporting the dielectric substrate in a uniform pattern to inhibit displacement of the dielectric substrate under load. In a specific embodiment, the posts are disposed in a regular array with a spacing of $d_x$ in a first direction and at a spacing of $d_y$ in a second direction over the wafer. The posts are sufficiently pliant to allow for thermal expansion of the dielectric substrate without causing warpage of the substrate. In a further specific embodiment, the probe tips are connected to a tester through one or more flexible sheets having embedded conductive traces. The invention could also be adapted to be used for testing a plurality of circuits in parallel which are mounted on a substrate, such as hybrid circuits.

According to another embodiment of the present invention, a wafer probe interconnect apparatus is provided for use in testing a plurality of dies on a semiconductor wafer. The apparatus includes a plurality of dielectric substrates having a plurality of probe tips protruding from a first surface. In some embodiments, the dielectric substrates are fabricated from a ceramic material. According to a particular embodiment, the plurality of probe tips are electrically coupled to a second opposing surface through conductive vias. The apparatus also includes a plurality of posts coupled to each of the plurality of dielectric substrates. In a specific embodiment, the plurality of posts is arrayed in a two dimensional pattern covering an entire semiconductor wafer. In another embodiment, the plurality of posts are flexible helical springs. The apparatus further includes at least one flexible sheet coupled to each of the plurality of dielectric substrates. The at least one flexible sheet has embedded conductive traces terminating at one end to the vias. The apparatus additionally includes a support block coupled to the plurality of posts.

Further according to the invention, a method of operating a wafer scale test system is provided. The method includes providing a plurality of dielectric substrates having a plurality of probe tips extending from a first surface and a plurality of contacts coupled to an opposing surface. The plurality of contacts is electrically connected to the probe tips through conductive vias. The method also includes coupling the plurality of dielectric substrates to a support block using a plurality of posts coupled to each of the plurality of dielectric substrates. In a specific embodiment, the posts are flexible spring posts. The method further includes applying a force to bring the plurality of probe tips into physical contact with a plurality of bonding pads present on a semiconductor wafer under test. The method additionally includes applying at least one input voltage to a plurality of contact terminals on a flexible electrical cable. In embodiments according to the present invention, the at least one voltage is electrically connected to the plurality of contacts via the flexible electrical cable. Moreover, the method includes monitoring at least one output voltage on the plurality of contact terminals on the flexible electrical cable.

Numerous benefits are achieved using the present invention over conventional techniques. For example, an embodiment of the present invention provides a means of supporting a probe head so as to avoid warping due to mechanical and thermal stresses. Further, the embodiment provides flexible electrical connections to the probe head by means of flex cables attached mechanically and electrically to the probe head. Another embodiment provides a means to support a plurality of probe heads held in planar alignment by means of posts attached to a rigid support block. This embodiment provides further benefit in allowing a wiring means to be interposed between the plurality of probe heads and the rigid support block whereby the wiring means does not exert excessive mechanical force on the probe head. By these advances, the present invention enables making large area wafer probes that are less susceptible to mechanical and thermal stresses.

Depending upon the embodiment, one or more of these benefits may exist. These and other benefits have been described throughout the present specification and more particularly below. Various additional objects, features, and advantages of the present invention can be more fully appreciated with reference to the detailed description and accompanying drawings that follow.

DETAILED DESCRIPTION OF SPECIFIC EMBODIMENTS

Figure 3:
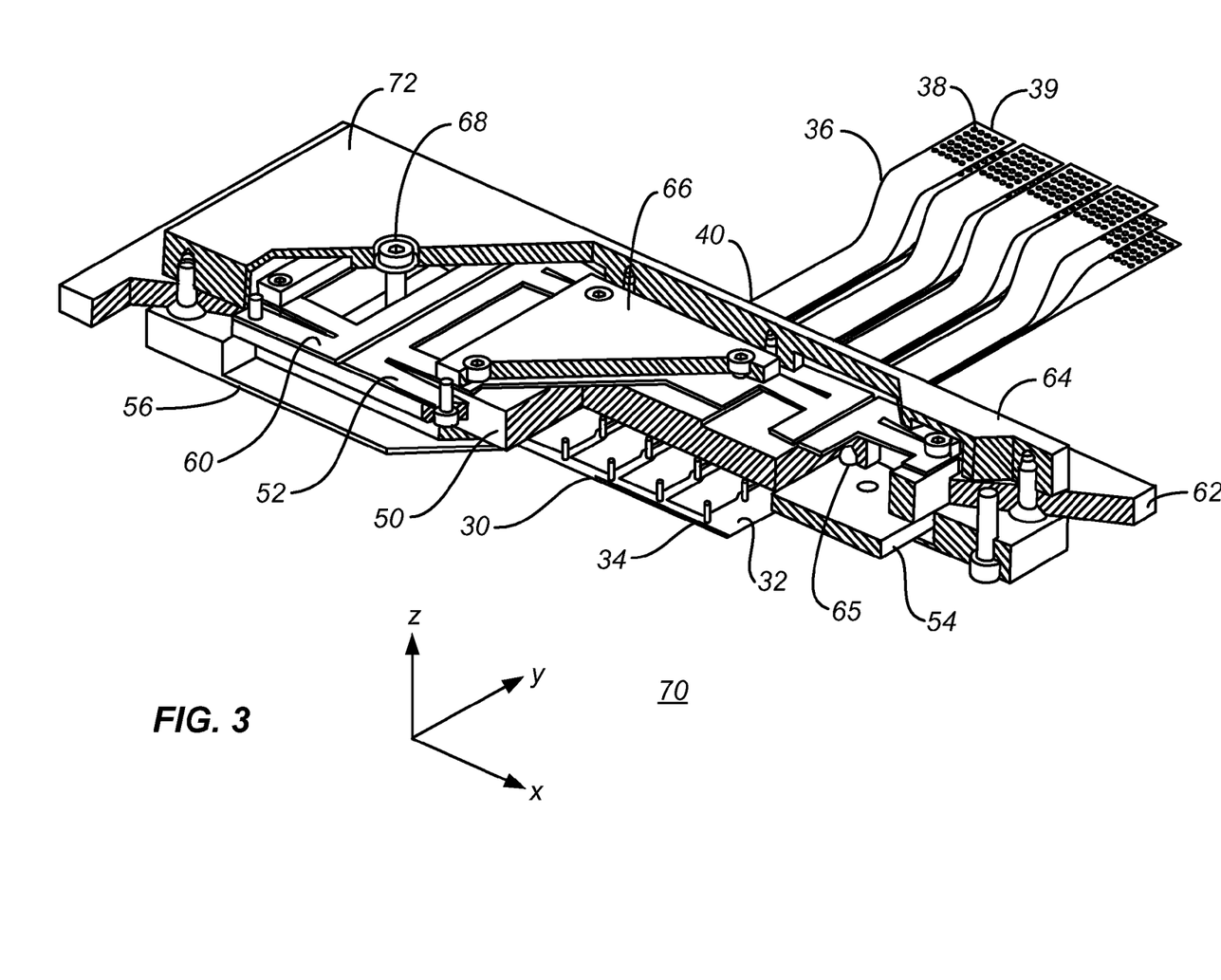
FIG. 3 is a simplified perspective view in partial cross-section illustrating a preferred embodiment of a wafer probe interconnect apparatus according to an embodiment of the invention.

FIG. 3 is a simplified perspective view in partial cross-section illustrating a preferred embodiment of a wafer probe interconnect apparatus 70 according to an embodiment of the invention. In some embodiments, the wafer probe interconnect apparatus is referred to loosely as a probe head. Wafer probe interconnect apparatus 70 of FIG. 3 operates so as to hold probe head 30 and to connect probes on the head with corresponding electrical test circuits by means of flexible cables (flex cables) 36. In an embodiment, the actual probe head 30 is held flat by support posts 34 even when under load. The support posts 34 are spaced in an array across the width and length of back surface 32 of probe head 30. One end of each post 34 is held in contact with back surface 32 of probe head 30 by solder, adhesive, slidable contact, or other mechanical means. The opposite end of each support post 34 is attached to a support block 50 such that the back surface 32 of the probe head 30 is fixed in a plane that is substantially independent of loading forces applied perpendicular to the probe head. An array of wafer probes (pins) is attached to the front surface of probe head 30 opposite to back surface 32. In one mode of operation according to embodiments of the present invention, a semiconductor wafer is probed by urging wafer probe interconnect apparatus 70 into contact with the front surface of the wafer such that the pins engage the surface of the wafer.

Electrical connections between probe head 30 and a test system of a type commonly used in the semiconductor industry are made by the flex cables 36. Contacts 38 on remote end 39 of each cable 36 are suited to making connection to the test system by means of for example Gold Dot™ connectors as supplied by Delphi Electronics of Irvine, Calif. Each of contacts 36 is linked to a corresponding contact at the near end 40 of flex cable 36. Terminal contacts 31 on the near end of the flex cable are electrically connected to probe tips on probe head 30. Flexible cables 36 allow near ends 40 of cable 36 to move with respect to remote ends 39 without applying significant loading forces on probe head 30. In a specific embodiment according to the present invention, each flex cable 36 is identical to the other flex cables in order to simplify design, particularly in respect to high frequency testing. Assembly of the apparatus is simplified by attaching each flex cable 36 separately to the probe head 30 and by bending the cable to fit into place in the assembly.

Posts 34 provide a space between back surface 32 of probe head 30 and support block 50 in order to allow for positioning of the flex cables without disturbing the position of probe head 30. In an embodiment of the present invention, the flex cables 36 include holes where the support posts 34 pass though the flex cable 36. This embodiment is utilized for designs where the flex cable 36 is wider than the space between the posts 34. In addition to supporting probe head 30 away from support block 50, posts 34 may be used to hold the probe head 30 in x-y registration with respect to the support block 50, where the x and y directions are measured across the width and length of the surface of the probe head 30 respectively, as illustrated by the axes shown in FIG. 3. As may be anticipated by one skilled in the art, one or more printed wiring circuit boards may be substituted for the flex cables. The printed wiring circuit boards are interposed between probe head 30 and support block 50. Posts 34 pass through holes in the printed wiring circuit board. Contacts on back surface 32 are flexibly connected to contacts on the printed wiring board.

Embodiments of the present invention provide methods and apparatus in which registration between the probe head and the support block is maintained during temperature changes. In a specific embodiment, the dimensions and materials from which the support posts 34 are fabricated are preselected to allow the posts to flex under certain conditions. Merely by way of example, in a particular embodiment, the posts 34 are fabricated from 0.5 mm diameter stainless steel 301 rods of a free length of 7 mm, thereby allowing the post to flex in order to accommodate differential expansion between probe head 30 and support block 50. In alternative embodiments, the thickness of the post ranges from about 0.4 mm to about 2 mm. Of course, the selection of materials and dimensions are related to achieve the desired flexibility. One of ordinary skill in the art would recognize many variations, modifications, and alternatives.

Support posts 34 are disposed in a regular array on the back surface 32 of probe head 30. Flexure of the posts 34 in the x and the y directions maintains the center of probe head 30 stationary with respect to a point on support block 50 immediately opposite the center of the probe head 30. In some embodiments, the support posts provide a flexing motion that enables the ceramic substrate of probe head 30 to not warp more than a displacement range (nominal lateral movement) of the probe tips, thereby providing a substantially flat surface to which the probe tips are attached.

The probe assembly, including probe head 30, support block 50, posts 34 and flex cables 36, is attached to body 62, 64, 72 by means of mounting springs 52. In the illustrated embodiment, mounting springs 52 are flat springs configured to incorporate pairs of legs that flex vertically while maintaining registration of the probe head in the x-y plane. One leg of each pair of legs on mounting spring 52 is attached to mounting block by clamp block 66. The other leg of the pair of legs is attached to body 62, 64, 72. In this embodiment, four pairs of legs are arranged symmetrically with respect to probe head 30, allowing each corner of the probe head to move vertically to accommodate non-parallel orientation of the probe head with respect to the wafer or device under test. As body 62, 64, 72 is urged into contact with the wafer under test, each of the four pairs legs of mounting spring 52 flexes to allow planar contact between the probe head and the wafer under test. The four-corner spring mounting allows probe head 30 to tilt about x and y axes in the plane of surface 32 in order to accommodate tilt of the wafer under test. Flex cables 36 move to allow adjustment of the position of probe head 30 without mechanical hindrance. Cover plate 56 covers flex cables 36 and prevents them from touching the surface of the wafer under test.

Mounting spring 52 is pre-loaded by tightening leveling screws 68 such that leveling plate 54 pushes ball supports 65 against mounting block 50 at several points. Leveling plate 54 is held in position by a pair of adjustment springs 60, one of which is disposed at each end of body 72. Each of several leveling screws 68 is adjusted to pre-tension mounting spring 52 and to level probe head 30. As the wafer probe interconnect apparatus 70 is lowered, causing probe head 30 to be urged into contact with the wafer under test, the assembly comprising probe head 30 and support block 50 is raised off of ball supports 65 by the force on the probe tips exerted by the wafer. When body 72 is withdrawn upwardly, after the test is complete, the assembly comprising probe head 30 and support block 50 comes to rest on ball supports 65. Alternatively, probe head 30 may be brought into contact with the wafer under test without raising the assembly of the probe head 30 and the support block 50 off of the ball supports. In this case, mechanical leveling by means of leveling the leveling screws is used to adjust the probe head 30 into a parallel orientation with respect to the wafer under test.

Figure 4A:
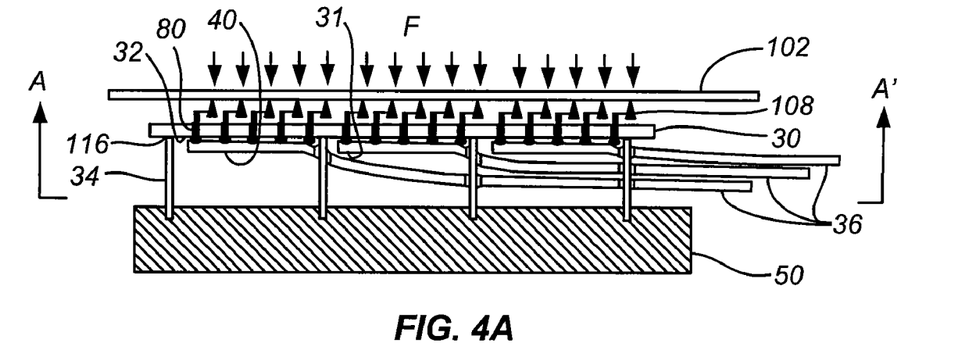
FIGS. 4A and 4B are simplified side cross-sectional views of a portion of a wafer probe head of FIG. 3 in a loaded configuration according to various embodiments of the present invention.
Figure 4B:
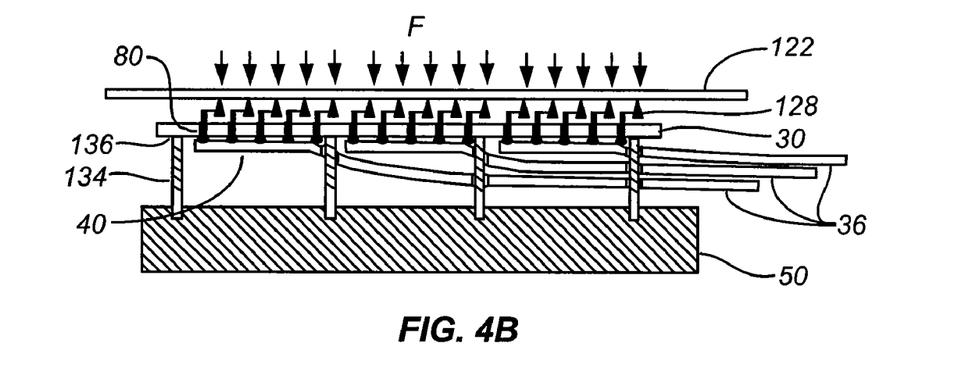

FIGS. 4A and 4B are simplified side cross-sectional views of a portion of a wafer probe head 30 of FIG. 3 in a loaded configuration according to various embodiments of the present invention. In embodiments according to the present invention, the probe head 30 is fabricated on an alumina sheet 0.5 mm thick. In alternative embodiments, other dielectric substrates, such as an aluminum nitride or multi-layer circuit board substrates are utilized. One of ordinary skill in the art would recognize many variations, modifications, and alternatives. In a specific embodiment, vias 80 0.1 mm in diameter are formed between a first region of the dielectric substrate and a second region opposing the first region. The vias 80 are filled with an electrically conductive material, for example, copper impregnated tungsten, by processes well known in the industry to form conductive via plugs. The conductive material filling the vias 80 (typically referred to as a via plug) connects probes (i.e., probe tips) coupled to the first region to contacts accessible from the second region. In another specific embodiment, the contacts are coupled to the second region 32 by plated stripes of nickel-copper films.

Figure 5:
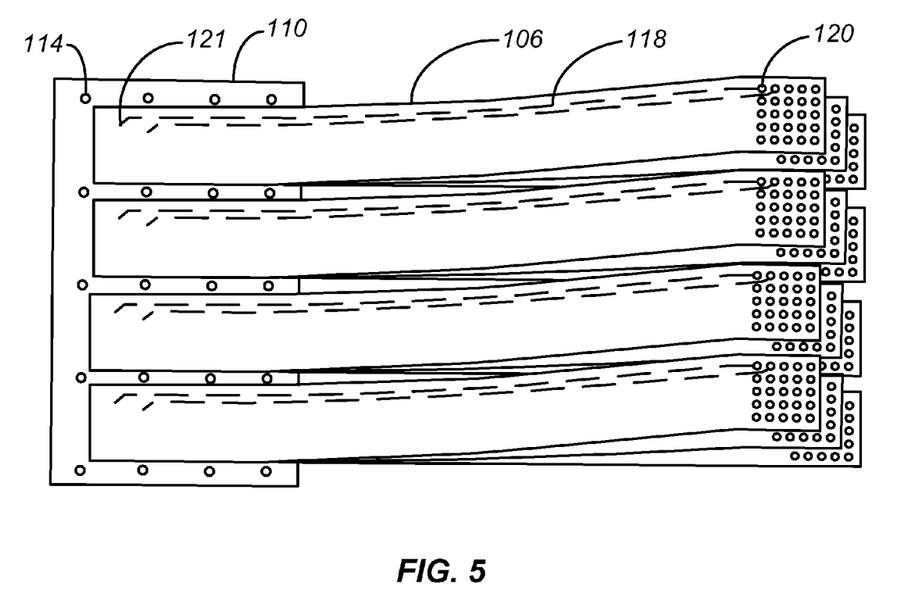
FIG. 5 is a simplified top view including the portion of the wafer probe of FIG. 3 showing a plurality of conductive-trace-carrying flexible sheets for interfacing with a test instrument.

Near ends 40 of flex cables 36, terminals are attached and electrically connected to contacts on second region or surface 32 of probe head 30. In an embodiment according to the present invention, terminals disposed on the ends 40 of the flex cables are attached by means of eutectic coated copper spheres 275 µm in diameter. In a specific embodiment, such as illustrated in FIG. 5, each flex cable 36 is attached to one of 12 sites on back surface 32 of probe head 30. Of course, the present invention is not limited to the spatial arrangement illustrated in FIG. 5. Other arrangements utilizing differing numbers of flex cables, connection schemes and differing numbers of contact sites are included in the scope of the present invention.

As illustrated in FIGS. 3, 4, and 5, an array of 20 posts 34 attaches the probe head 30 to the support block 50. In a specific embodiment, the posts 34 are fabricated from stainless steel Type 301, are each about 0.5 mm in diameter, and about 7 mm long. In an alternative embodiment, the material and/or dimensions of the posts are varied as a function of position across the support block 50. Merely by way of example, in an embodiment, the post thickness decreases with increasing distance from the center of the support block 50. Thus, the flexibility of the posts 34 at peripheral portions of the substrate is greater while posts 34 at central portions provide sufficient rigidity to prevent warpage.

In a particular embodiment, support block 50 may be made of Anviloy®, a composite tungsten material, available from CMW, Inc. of Indianapolis, Ind. The support block provides a rigid support member for the probe head assembly 70. Posts 34 are typically press fit into holes provided in support block 50, and the distal ends are precision ground to ±10 µm flatness across the entire array of posts 34. As illustrated in FIG. 3, a support block 50 is attached to the body 72 by means of two flat springs 52, which may be made by laser cutting 0.5 mm thick stainless steel Type 301. Two adjustment springs 60 are also fabricated as stainless steel flat springs made by laser cutting stainless steel Type 301 material.

In some embodiments, each flex cable 36 comprises a polyimide flex sheet with copper circuit traces on one side and a copper ground plane on the opposite side. In a specific embodiment, the polyimide flex sheet is a 50 µm thick strip of DuPont™ Kapton® E, manufactured by DuPont High Performance Materials of Circleville, Ohio. On both the top and bottom surfaces of the polyimide layer, 18 µm thick copper layers are formed. The copper layer on the top side is patterned to form 50 µm wide traces that are spaced apart by 100 µm of space between adjacent traces. A blanket copper layer on the bottom side serves as a ground plane that provides shielding of the circuit traces on the opposite side of the polyimide layer. The circuit density of the traces on one side of flex cable 36 is adequate for wiring a DRAM memory chip with 60 electrical contacts. Circuit traces on flex cable 36 connect the terminals adjacent near end 40 to 0.5 mm diameter contact bumps 38 at remote end 39 of the flex cable 36. Typically, each array of contact pads is connected to an array of mating pads on a printed circuit board on a test fixture by means of a clamp and an elastomeric pad that is interposed between the clamp and remote end 39 of flex cable 36.

In a specific embodiment, probe head 70 is attached to a 300 mm diameter printed circuit board. Each remote end 39 of flex cables 36 is connected to mating contacts on the printed circuit board. Probe head 30 is leveled by adjusting leveling screws 68, such that the probe head is parallel with the wafer under test. Probe head 70 is then urged downward toward the wafer under test such that probes on probe head 30 make contact with corresponding pads on the surface of the wafer under test.

FIG. 4A is a simplified side cross-sectional view of a portion of a wafer probe head of FIG. 3 in a loaded configuration according to an embodiment of the present invention. By way of example, this loaded configuration may be present during operation of the apparatus during wafer probing. During the operation of the wafer probe interconnect apparatus, wafer 102 is urged against probe tips 108 by a distributed force F. Each of the probe tips 108 acts as a spring to transmit a force to dielectric substrate 30. As described previously, embodiments of the present invention act to substantially maintain flatness of substrate 30 by means of supporting posts 34. Each distal end 116 of each post 34 is set at a known height above rigid support block 50 by precision grinding of the posts 34 before attachment of the substrate 30 to the posts 34. The array of posts 34 supports substrate 30 along its length and breadth, acting to minimize distortion of the substrate 30 under the load of force F during wafer probing.

FIG. 4B is a simplified side cross-sectional view of a portion of a wafer probe head of FIG. 3 in a loaded configuration according to an alternative embodiment of the present invention. In the alternative embodiment illustrated in FIG. 4B, the posts supporting substrate 30 are helical spring posts 134. Spring posts 134 allow the substrate 30 to flex in order to accommodate a non-planar wafer 122 under test. In a specific embodiment, the spring constant of spring posts 134 is chosen to allow a compression of between 0.01 and 0.2 mm when a force F is applied to wafer 122 to urge the wafer into contact with probes 128. Typically, a force of between 1 and 10 grams per probe is necessary to make positive contact. In a particular embodiment, spring posts 134 are machined helical springs fabricated from a cylindrical tube of high tensile material. As an example, machined helical springs are supplied by Helical Products Company of Santa Maria, Calif. Ends 136 of spring posts 134 support substrate 30 above rigid support block 50. The space between substrate 30 and rigid support block 50 allows flex cables 36 interposed therebetween to move freely in response to compression of spring posts 134.

FIG. 5 is a simplified top view including the portion of the wafer probe of FIG. 3 showing a plurality of conductive-trace-carrying flexible sheets for interfacing with a test instrument (not shown). In an embodiment according to the present invention, the flexible sheets are high performance cables. Substrate 30 is supported by an array of 4×5 posts 34. Of course, embodiments of the present invention are not limited to this particular geometry. In the embodiment illustrated in FIG. 5, three flex cables 106 are positioned between each row of posts 34. Each probe end 121 of flex cable 106 is electrically connected to a corresponding probe tip on the opposite side of substrate 30.

In the embodiment illustrated in FIG. 5, each of the 12 flex cables 106 is identical to the other cables, such that a trace 118 in one cable is the same length as the corresponding trace in all of the other cables. As a result, design of electrical testing is simplified because the electrical characteristics of each trace 118 connecting a probe end 121 to a tester end 120 has the same electrical characteristics as the corresponding trace in each of the other cables. Also, because each trace 118 connects a probe end 121 to a tester end 120 without the need for going through vias or plated through holes in a circuit board, the electrical characteristics of trace 118 do not exhibit electrical reflections and impedance discontinuities typically present in printed circuit board layouts utilizing plated-through holes, as in some wafer probes.

As illustrated in FIGS. 4A and 5, embodiments of the present invention provide for running high performance cables that connect the probe tips to electrical testing circuits that lie at some distance from the probe head. As shown in FIG. 4A, posts 34 hold probe head substrate 30 at a set spacing distance away from rigid support block 50. Flex cables 36 are interposed between probe head substrate 30 and rigid support block 50. As illustrated in FIG. 5, leads 118 in the flex cables 106 run in the spaces between rows of posts 34. Notches or holes through the flex cables or other printed circuit accommodate posts 34 that they pass though the printed circuit.

Figure 6:
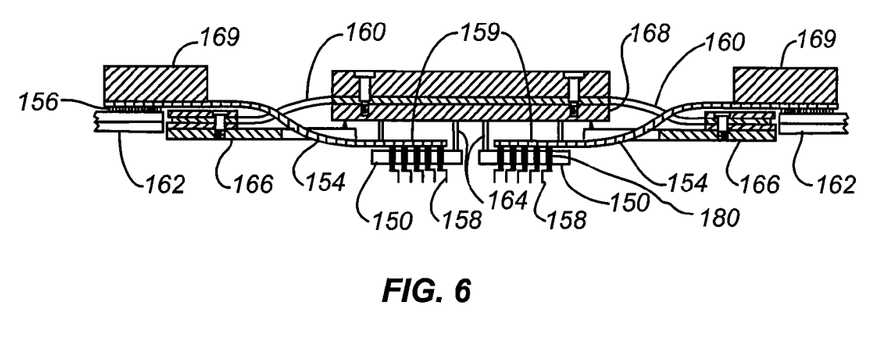
FIG. 6 is a simplified side cross-sectional view of a further embodiment of a probe head according to the invention in which the probe substrate is segmented.

FIG. 6 is a simplified side cross-sectional view of a further embodiment of a probe head according to the invention in which the probe substrate is segmented. As illustrated in FIG. 6, the probe head is divided into a number of separate subsections. Probe tips 158 are mounted on a number of dielectric substrates 150. Although the substrates 150 illustrated in FIG. 6 are identical, this is not required by the present invention. In alternative embodiments, substrates 150 are fabricated in different sizes. In some of these alternative embodiments, the sizes of the substrates 150 are selected to accommodate a particular wafer being tested. Merely by way of example, a full wafer may be probed with the wafer probe interconnect apparatus provided according to embodiments of this invention by dividing the probe head into the four quadrants of a circle, where each quadrant may be differently designed. According to embodiments of the present invention, the wafer probe interconnect apparatus includes a plurality of dielectric substrates arrayed in a two dimensional pattern covering an entire wafer, for example, a 300 mm wafer currently utilized in many semiconductor processing operations. Of course, as wafer sizes are scaled up to larger diameter wafers, embodiments of the present invention may be scaled up appropriately, by adding additional dielectric substrates and/or by increasing the size or the individual dielectric substrates. One of ordinary skill in the art would recognize many variations, modifications, and alternatives.

In a specific embodiment, the substrates 150 are dielectric substrates fabricated from alumina sheet material. In alternative embodiments, other dielectric substrates, such as an aluminum nitride or multi-layer printed wiring substrates are utilized. As discussed in relation to FIGS. 3, 4, and 5, conductive vias 80 are formed through the dielectric substrates in embodiments according to the present invention, electrically coupling the probe tips 158 on one surface to contacts on the opposing surface.

As illustrated in FIG. 6, each substrate 150 is supported by posts 164. In a specific embodiment, the spring posts are fabricated in the same manner as those illustrated in FIG. 4B. The spring posts compress to allow each of the substrates 150 to align parallel to the plane of the wafer being probed. The spring posts 164 hold each of substrates 150 above a support block 168. In some embodiments, the support block 168 is selected for its material properties, including rigidity. Flex cables 154 electrically couple probes 158 at contact terminals 159 to contact terminals 155 (see FIG. 7). Accordingly, the contact terminals 155 on the flex cables 154 are coupled to contacts 156 on printed circuit board 162. The flex cables 154 pass between spring posts 164 as more fully described below. Support block 168, with substrates 150 mounted to it, are leveled and set to a selected height by adjusting the position of leveling plate 166. Flat springs 160, attached to mounting ring 169, maintain tension between support block 152 and leveling plate 166.

Figure 7:
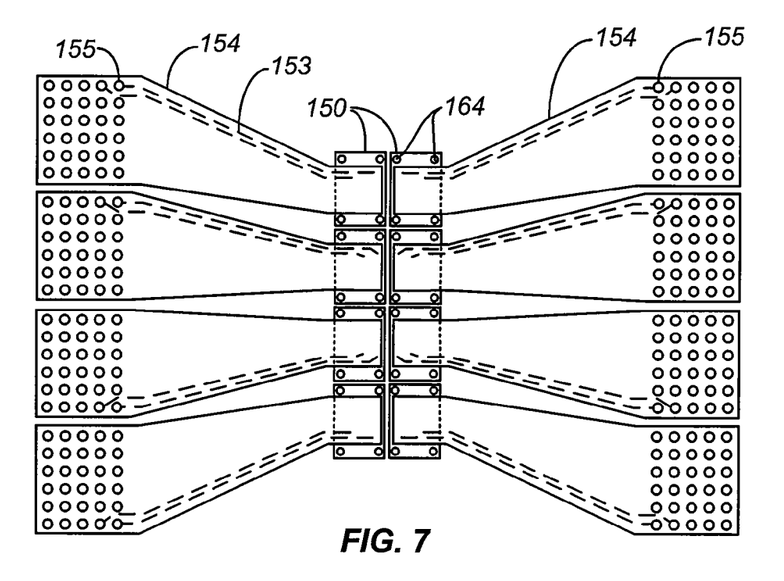
FIG. 7 is a top view including the portion of a further embodiment of the wafer probe of FIG. 6 showing a plurality of conductive-trace-carrying flexible sheets for interfacing with a test instrument.

FIG. 7 is a top view including the portion of a further embodiment of the wafer probe of FIG. 6 showing a plurality of conductive-trace-carrying flexible sheets for interfacing with a test instrument. As illustrated in FIG. 7, eight substrates 150 are spatially arranged in an array of two columns and four rows. At a peripheral corner of each substrate, four posts 164 support the substrate. As illustrated in FIG. 6, the posts couple the substrates 150 to the support block 168. Although the posts are illustrated as coupled to the peripheral corner regions of the substrates in FIG. 7, this is not required by the present invention. In alternative embodiments, a regular array of posts is disposed with a predetermined x spacing and predetermined y spacing over each substrate.

As illustrated in FIG. 7, one flex cable 154 is attached to each substrate 150, and is positioned between posts 164 supporting the substrate. Traces 153 in flex cable 154, along with the conductive via plugs 180 (FIG. 6) and contacts, electrically connect the probe tips on substrate 150 to corresponding contact terminals 155 on the flex cable. Although this embodiment shows one flex cable 164 connected to each substrate 150, it will be evident to one of skill in the art that more than one such cable may be attached to each substrate. It will also be evident to one skilled in the art that more than one substrate may be attached to one wiring layer such as a flex cable. Additionally, the cable may contain holes to accommodate support posts that pass through the cable. One of ordinary skill in the art would recognize many variations, modifications, and alternatives.

The invention has been explained with reference to specific embodiments. Other embodiments will be apparent to those of ordinary skill in the art. It is therefore not intended that this invention be limited, except as indicated by the appended claims.

What is claimed is:

1. An apparatus for use in testing a plurality of integrated circuit dies in an array, the apparatus comprising:
    a plurality of dielectric substrates having a plurality of probe tips protruding from a first surface, wherein the plurality of probe tips is electrically coupled to a second opposing surface through conductive via plugs;
    a plurality of pliant posts coupled to each of the plurality of dielectric substrates, the posts being sufficiently laterally pliant to allow for thermal expansion of the dielectric substrate without warpage of the dielectric substrate;
    a support block coupled to the plurality of pliant posts;
    a plurality of printed wiring layers disposed in overlaid sheets and interposed between the plurality of dielectric substrates and the support block and extending from between rows of said pliant posts, wherein
    embedded conductive traces in the printed wiring layers are individually terminated at one end to a via plug and wherein the flexible sheets are a plurality of flex cables.

* * * * *